(12) United States Patent
Wang et al.

(10) Patent No.: US 10,568,169 B2
(45) Date of Patent: Feb. 18, 2020

(54) CONTROL CIRCUIT, CONTROL METHOD AND LED DRIVER THEREOF

(71) Applicant: Silergy Semiconductor Technology (Hangzhou) LTD, Hangzhou (CN)

(72) Inventors: Longqi Wang, Hangzhou (CN); Jianxin Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/151,453

(22) Filed: Oct. 4, 2018

(65) Prior Publication Data
US 2019/0116637 A1    Apr. 18, 2019

(30) Foreign Application Priority Data
Oct. 12, 2017  (CN) .......................... 2017 1 0948375

(51) Int. Cl.
*H05B 33/08* (2006.01)
*H03K 5/24* (2006.01)
*H03L 7/087* (2006.01)

(52) U.S. Cl.
CPC ........... *H05B 33/0815* (2013.01); *H03K 5/24* (2013.01); *H03L 7/087* (2013.01); *H05B 33/0851* (2013.01)

(58) Field of Classification Search
CPC ............ H05B 33/0815; H05B 33/0845; H05B 33/0818; H05B 33/0851; H05B 33/086
See application file for complete search history.

(56) References Cited

U.S. PATENT DOCUMENTS

| | | | |
|---|---|---|---|
| 8,614,551 B2 | 12/2013 | Chen et al. | |
| 9,125,270 B2 | 9/2015 | Liao et al. | |
| 9,237,623 B1* | 1/2016 | Lewis | H05B 33/0815 |
| 9,578,706 B1 | 2/2017 | Lai et al. | |
| 2009/0160368 A1* | 6/2009 | Godbole | H05B 33/0818 315/307 |
| 2010/0026203 A1* | 2/2010 | Zhao | H05B 33/0815 315/291 |
| 2014/0062322 A1* | 3/2014 | Yu | H05B 33/0851 315/200 R |
| 2014/0139196 A1* | 5/2014 | Chen | H02M 3/156 323/271 |
| 2015/0145439 A1* | 5/2015 | Szolusha | H05B 33/0851 315/307 |

* cited by examiner

*Primary Examiner* — Tung X Le
*Assistant Examiner* — Borna Alaeddini
(74) *Attorney, Agent, or Firm* — Michael C. Stephens, Jr.

(57) ABSTRACT

A method of controlling an LED driver can include: generating a sinusoidal half-wave signal having the same frequency and phase as an AC input voltage by utilizing a phase-locked loop; generating a sampling signal of a peak value of an inductor current in a power stage circuit of the LED driver; generating a loop compensation signal in accordance with the sinusoidal half wave signal and a signal representing an output current of the power stage circuit; and generating a switching control signal for controlling the power stage circuit in accordance with the sampling signal and the loop compensation signal.

9 Claims, 8 Drawing Sheets

CONTROL CIRCUIT, CONTROL METHOD AND LED DRIVER THEREOF

RELATED APPLICATIONS

This application claims the benefit of Chinese Patent Application No. 201710948375.4, filed on Oct. 12, 2017, which is incorporated herein by reference in its entirety.

FIELD OF THE INVENTION

The present invention generally relates to the field of power electronics, and more particularly to LED drivers, along with associated circuits and methods.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Light-emitting diode (LED) lighting is widely used in a wide variety of application fields, such as home, office, outside lighting, and stage lighting. An LED driver can drive various types of LED loads in order to provide illumination. Designers may expect that the LED driver may have sufficiently high power factor (PF) and sufficiently low total harmonic distortion (THD). Furthermore, the LED driver can also typically respond quickly to jitters of an alternating current (AC) input power source, in order to eliminate variations of an output current due to the jitters.

Figure 1:
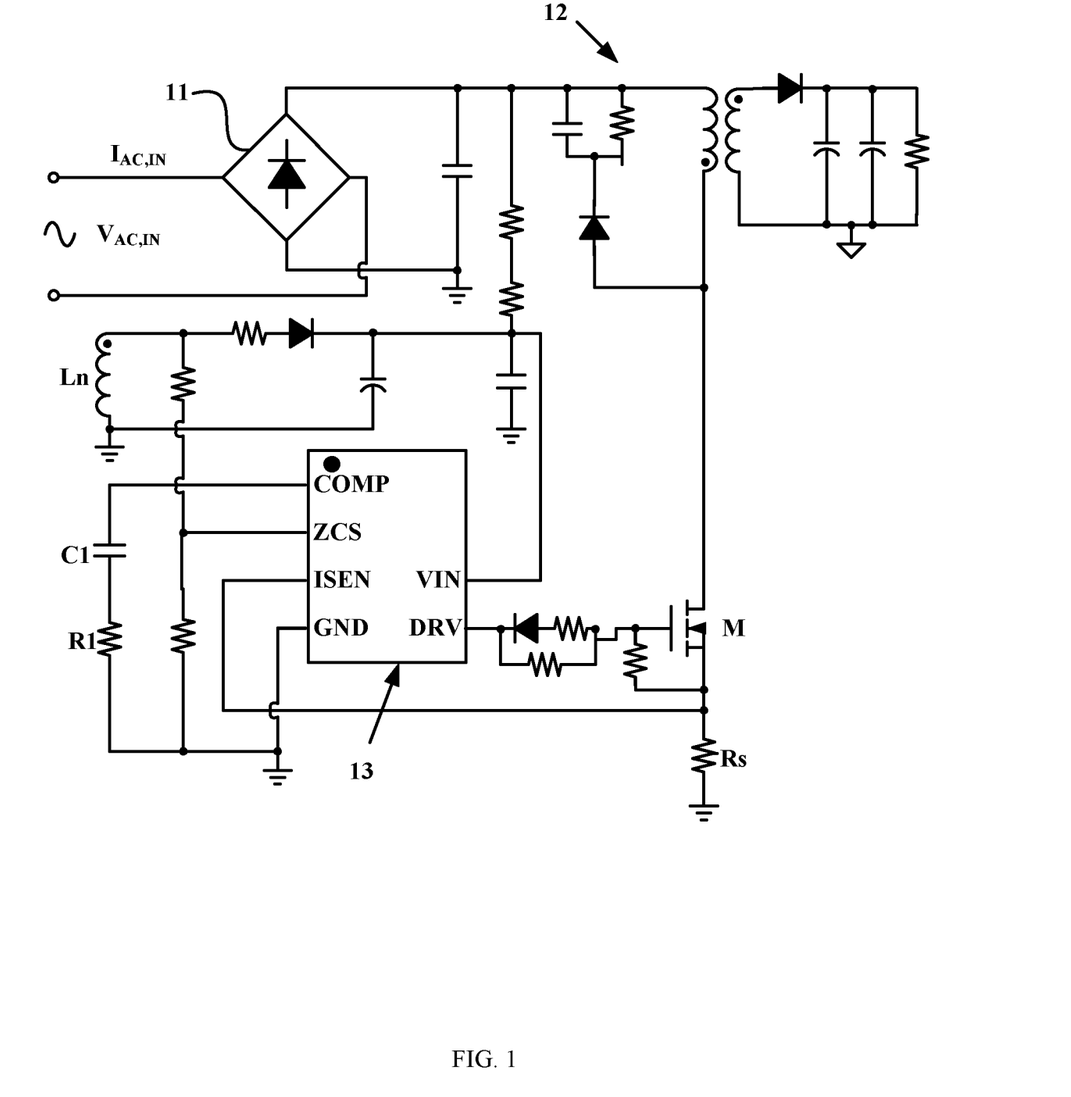
FIG. 1 is a schematic block diagram of an example LED driver utilizing constant on-time control.

Referring now to FIG. 1, shown is a schematic block diagram of a comparative example LED driver by utilizing constant on-time control. In this particular example, the LED driver can include a power stage circuit having rectifier bridge 11 and flyback converter 12, as well as control circuit 13. Control circuit 13 can obtain a zero-crossing time of an inductor current through auxiliary winding Ln and input the zero-crossing time to terminal ZCS. Control circuit 13 can obtain a sample signal of the inductor current through sample resistor Rs and input the sample signal to terminal ISEN. A compensation circuit formed by resistor R1 and capacitor C1 connected in series can generate a compensation signal at terminal COMP. The compensation signal can characterize an error between the inductor current and a desired inductor current, or between the sample signal of the output current and a desired output current. Switching control signal Q generated by control circuit 13 can control power transistor M of flyback converter 12 to be turned on or off, such that the output current can be remain substantially constant and tend to be a desired value.

In one example, the resistance of resistor R1 can be relatively large, and the capacitance of capacitor C1 can be relatively small, such that the compensation signal can quickly respond to variations of the output current. This can eliminate a sudden change of the output current that may be caused by the instability of the alternating current input power. As a result, control loop circuit with faster response speeds can be formed. When the AC input power jitters, the control loop circuit can realize quick adjusting, in order to suppress the excess energy caused by input jitter from being transmitted to the output terminal and to keep the output current stable. The compensation signal of the control loop circuit may correspond to on-time $t_{ON}$ in each switching cycle. The faster the response speed of the control loop circuit is, the greater the variation of the compensation signal is in a power frequency cycle, such that on-time $t_{ON}$ can also greatly vary. This can cause the input current at the input terminal to fail to follow the input voltage, the input current to severely distort, and the parameters of power factor and total harmonic distortion to fail to meet requirements.

In another example, the control loop circuit can be formed by utilizing a constant on-time control, such that the AC input voltage and input current can be expressed as follows in formulas (1) and (2).

$$V_{IN,AC}(t) = \sqrt{2} V_{AC} \sin(2\pi f_{AC} t) \quad (1)$$

$$\bar{i}_{IN,AC}(t) = \frac{1}{2} \times \frac{|V_{IN,AC}(t)| \times t_{ON}}{L_M} \times \frac{t_{ON}}{t_S(t)} = \frac{\sqrt{2}}{2} \times \frac{|\sin(2\pi f_{AC} t)| \times t_{ON}^2}{L_M \times t_S(t)} \quad (2)$$

Here, $V_{IN\_AC}(t)$ is the AC input voltage, $I_{IN\_AC}(t)$ is an average value of the input current in one switching cycle, $V_{AC}$ is an amplitude of the alternating current input voltage, $f_{AC}$ is a frequency of the alternating current input power, $L_M$ is the inductance of the inductor of the power stage circuit, $t_{ON}$ is the on-time, and $t_S(t)$ is the switching cycle. As shown in the above formulas, switching cycle $t_S(t)$ can vary within a smaller range in one power frequency cycle, such that the input current can approximately be a sinusoidal signal having the same frequency with the AC input voltage from the entire power frequency cycle. The control loop circuit can obtain higher power factor and lower total harmonic distortion by utilizing constant on-time control. However, the control loop may have a lower response speed due to constant on-time $t_{ON}$, and may not solve potential instability problems of the output current that may be caused by jitters of the AC input voltage. In particular embodiments, improved power factor and total harmonic distortion, as well as suppression the influence of jitters of the AC input voltage on the output current, can be achieved.

In one embodiment, a control circuit for controlling a power stage circuit of an LED driver, can include: (i) a phase-locked loop configured to generate a sinusoidal half-wave signal having the same frequency and phase as an AC input voltage; (ii) a sampling circuit configured to generate a sampling signal of a peak value of an inductor current in the power stage circuit; (iii) a loop compensation circuit configured to generate a loop compensation signal in accordance with the sinusoidal half wave signal and a signal representing an output current of the power stage circuit; and (iv) a switching control signal generating circuit configured to generate a switching control signal for controlling the power stage circuit in accordance with the sampling signal and the loop compensation signal.

Figure 2:
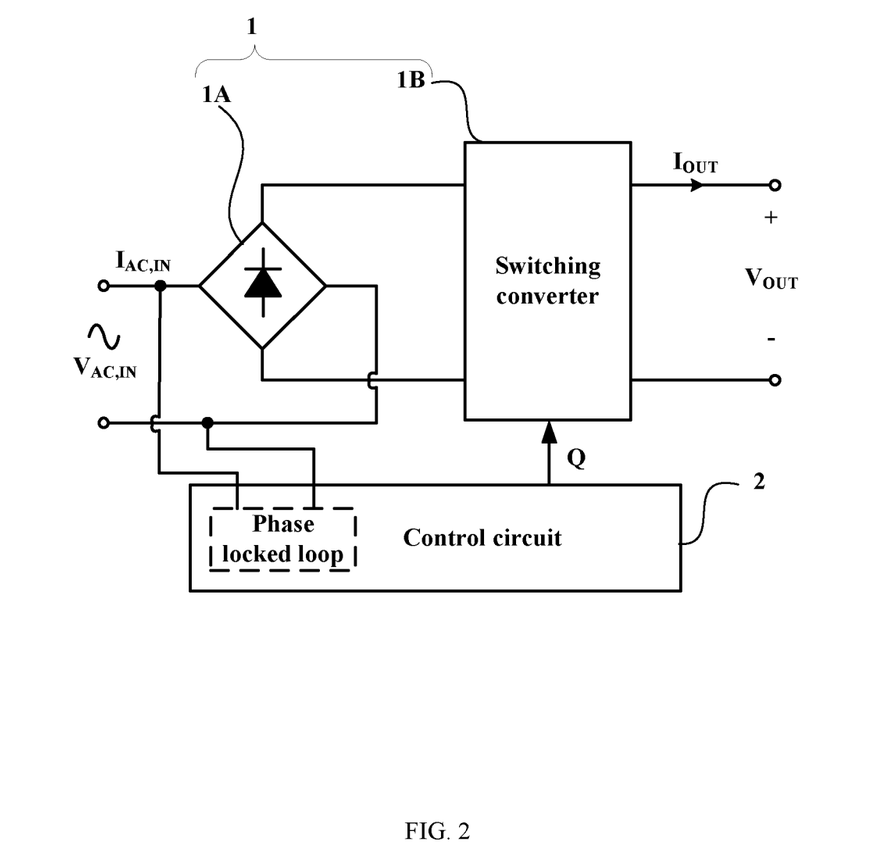
FIG. 2 is a schematic block diagram of an example LED driver, in accordance with embodiments of the present invention.

Referring now to FIG. 2, shown is a schematic block diagram of an example LED driver, in accordance with embodiments of the present invention. In this particular example, the LED driver can include power stage circuit 1 and control circuit 2, and power stage circuit 1 can include rectifier circuit 1A and switching converter 1B. Control circuit 2 can control power stage circuit 1. In this example, control circuit 2 can generate a sinusoidal half-wave signal having the same frequency and phase as an AC input voltage by a phase-locked loop, and may generate switching control signal Q to control power stage circuit 1 according to the sinusoidal half-wave signal.

The phase-locked loop (PLL) is an automatic closed-loop control circuit to realize phase synchronization of two electrical signals, and can make a phase of an output signal follow a phase of an input signal, thereby keeping the phase consistent. The working principle of a phase-locked loop is to detect a phase difference between the input signal and the output signal, and to convert the detected phase difference by a phase detector into a voltage signal. The voltage signal generated by the phase detector may be filtered by a low-pass filter to be a control voltage of an oscillator. Also, a frequency of the output signal generated by the oscillator can be controlled by the control voltage, and the frequency and phase of the output signal generated by the oscillator can be fed back to the phase detector through a feedback path.

In this example, the phase-locked loop is provided in control circuit 2, and can generate sinusoidal half-wave signal sin(WAC*t) having a constant amplitude and the same frequency and phase as the AC input voltage. Control circuit 2 can generate a switching control signal to control power stage circuit 1, such that the peak value of the inductor current follows sinusoidal half-wave signal sin(WAC*t). Since sinusoidal half-wave signal sin(WAC*t) has the same frequency and phase as the AC input voltage, the peak value of the inductor current can actually have the same frequency and phase with the AC input voltage. Furthermore, the input current related to the inductor current may follow the AC input voltage, thereby realizing higher power factor and lower total harmonic distortion. Further, the amplitude of sinusoidal half-wave signal sin(WAC*t) may not vary following the amplitude of the AC input voltage, such that the peak value of the inductor current can remain stable, effectively preventing sudden changes of the output current that may be caused by the fluctuation of the power grid.

Figure 3:
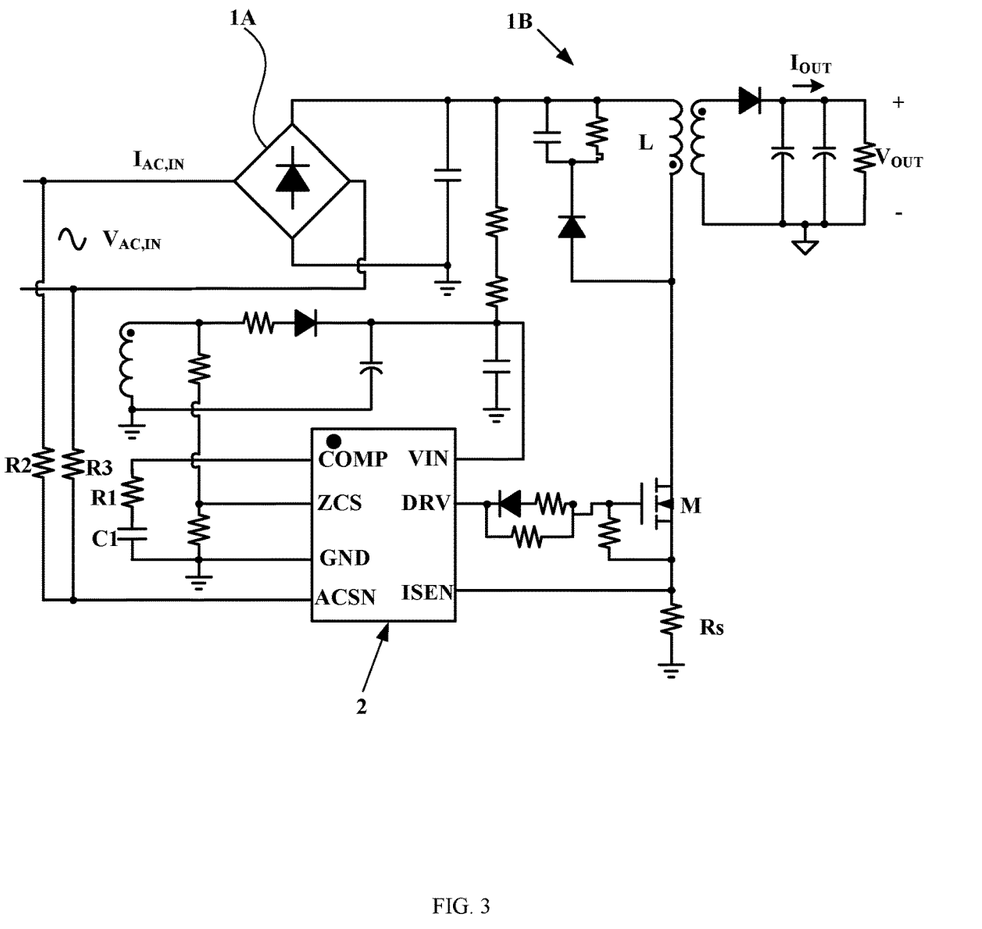
FIG. 3 is a schematic block diagram of another example LED driver, in accordance with embodiments of the present invention.

Referring now to FIG. 3, shown is a schematic block diagram of another example LED driver, in accordance with embodiments of the present invention. In this particular example, flyback converter 1B can perform direct current to direct current conversion on a direct current voltage generated by rectifier bridge 1A. Control circuit 2 can sample the AC input voltage at terminal ACSN by a resistor divider network (e.g., including resistor R2 and resistor R3) connected to two input terminals of the LED driver, in order to track the frequency and phase of the AC input voltage. The AC input voltage can be alternatively sampled directly or indirectly by any other suitable circuit/approach in certain embodiments. Resistor R1 and capacitor C1 can connect between terminal COMP of the control circuit and ground, in order to generate a current compensation signal at terminal COMP.

Figure 4:
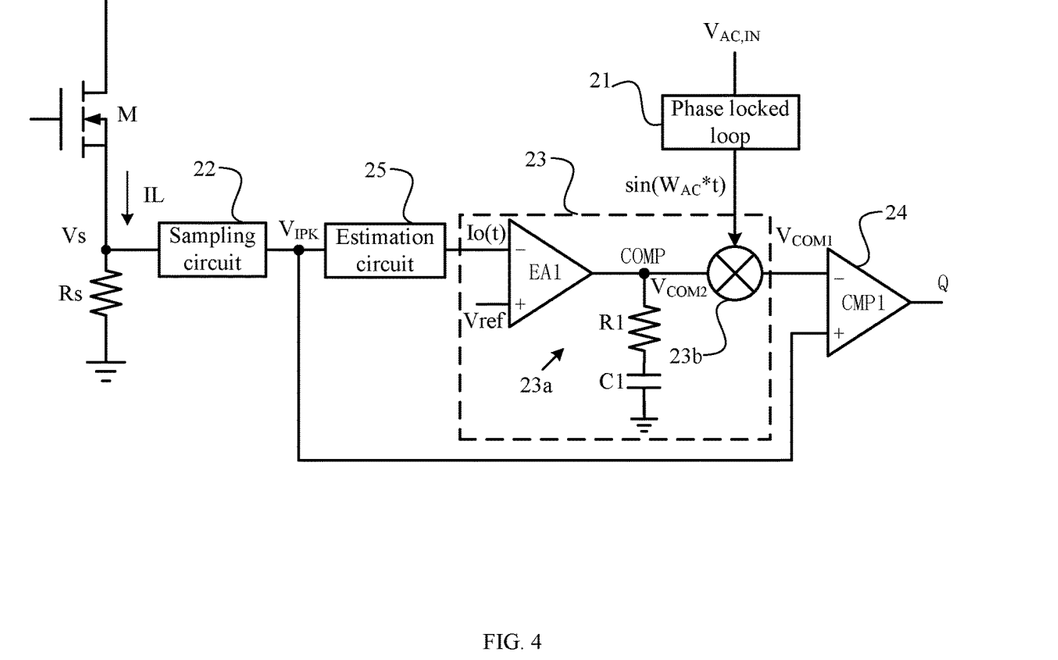
FIG. 4 is a schematic block diagram of an example control circuit, in accordance with embodiments of the present invention.

Referring now to FIG. 4, shown is a schematic block diagram of an example control circuit, in accordance with embodiments of the present invention. In this particular example, control circuit 2 can include phase-locked loop 21, sampling circuit 22, loop compensation circuit 23, and switching control signal generating circuit 24. Phase-locked loop 21 can generate sinusoidal half-wave signal sin(WAC*t) having the same frequency and phase as the AC input voltage. Sampling circuit 22 can sample present peak value $I_{PK}$ of the inductor current in the power stage circuit in order to generate sampling signal $V_{IPK}$ (e.g., a voltage signal). Current IL flowing through power transistor M can be converted into voltage Vs by resistor Rs. Sampling circuit 22 can sample the peak value of voltage Vs in order to generate sampling signal $V_{IPK}$. Loop compensation circuit 23 can generate loop compensation signal $V_{COM1}$ in accordance with output current signal Io(t) that characterizes the output current of the power stage circuit and sinusoidal half-wave signal sin(WAC*t). Switching control signal generating circuit 24 can generate switch control signal Q of the power stage circuit in accordance with peak value IPK of the inductor current and loop compensation signal $V_{COM1}$.

Loop compensation circuit 23 can include compensation circuits 23a and 23b. Compensation circuit 23a can generate current compensation signal $V_{COM2}$ in accordance with output current signal Io(t). For example, compensation circuit 23a can include error amplifier EA1, resistor R1, and capacitor C1. Resistor R1 and capacitor C1 can connect in series at output terminal COMP of error amplifier EA1. Error amplifier EA1 can receive output current signal Io(t) at one input terminal, and reference signal Vref characterizing the desired value of the output current at another input terminal, and may generate a current characterizing an error between output current signal Io(t) and reference signal Vref. The current generated by error amplifier EA1 can charge capacitor C1 in order to generate current compensation signal $V_{COM2}$. During circuit operation, capacitor C1 can continuously be charged and discharged, such that current compensation signal $V_{COM2}$ can be a direct current voltage with smaller ripples. Compensation circuit 23b can multiply current compensation signal $V_{COM2}$ by sinusoidal half-wave signal sin(WAC*t) in order to generate loop compensation signal $V_{COM1}$, and loop compensation signal $V_{COM1}$ can be expressed as below in formula (3).

$$V_{COM1} = V_{COM2} * \sin(W_{AC} * t) \quad (3)$$

Switching control signal generating circuit 24 can include comparator CMP1 for comparing sampling signal $V_{IPK}$ characterizing the peak value of the inductor current against loop compensation signal $V_{COM1}$ in order to generate switching control signal Q of power stage circuit 1. Switching control signal Q can control power switch M of switching converter 1B in power stage circuit 1. Peak value $I_{PK}$ of the inductor current can substantially vary following the changes of sinusoidal half-wave signal sin(WAC*t) by utilizing above loop circuit control. Furthermore, peak value $I_{PK}$ of the inductor current can vary following AC input voltage $V_{AC,IN}$ in phase, thereby realizing improved power factor and total harmonic distortion. The amplitude of loop compensation signal $V_{COM1}$ can be independent of the amplitude of AC input voltage $V_{AC,IN}$, and may only be related to the error between the output current and a desired output current of the power stage circuit. Therefore, the control circuit of this particular example can effectively stabilize the output current to substantially avoid being influenced by jitters of the AC input voltage.

For various switching converters, a signal characterizing the output current of the power stage circuit can be generated in accordance with the peak value of the inductor current. Therefore, estimation circuit 25 can be provided in order to generate output current estimation signal Io(t) estimated in accordance with the sampling signal of the peak value of the inductor current, or a sampling signal of the inductor current. Output current estimation signal Io(t) can characterize the output current of the power stage circuit. Therefore, the signal characterizing the output current of the power stage circuit can be generated without specifically setting the sampling circuit to sample the output current. Thus, the pins of the integrated circuit for forming the control circuit, numbers of peripheral components, and the size and volume of the overall circuit, can accordingly be reduced. In order to sample the output current of isolated converters, a sampling signal from the secondary side may need to be transmitted to the primary side by an optocoupler. In particular embodiments, the output current can be estimated by directly sampling the primary side for isolated converters, such that multiple circuits can be saved (e.g., optocoupler, secondary side sampling resistors, etc.).

Figure 5:
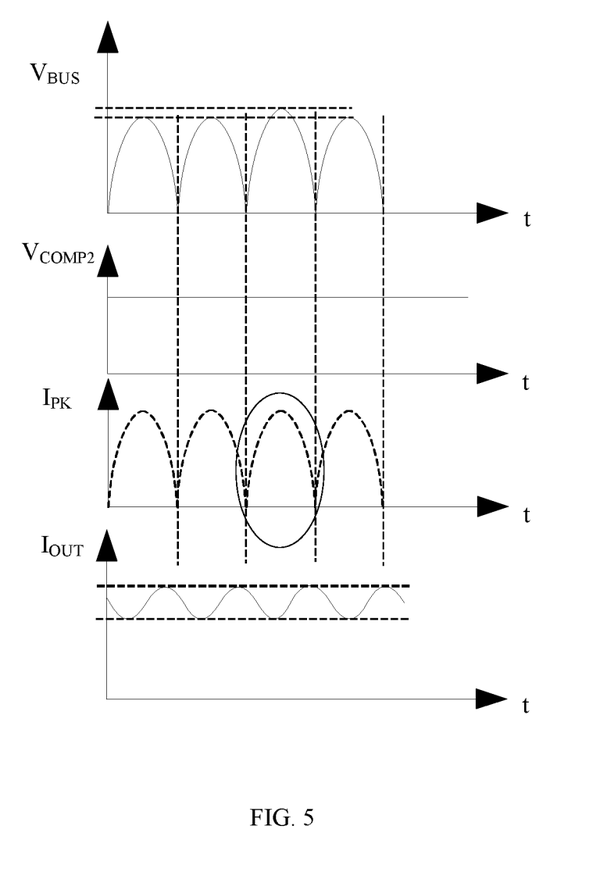
FIG. 5 is a waveform diagram of example operation of the LED driver, in accordance with embodiments of the present invention.

Referring now to FIG. 5, shown is a waveform diagram of example operation of the example LED driver, in accordance with embodiments of the present invention. In particular embodiments, the input current can be expressed as below in (4).

$$I_{AC,IN} = \frac{1}{2} \cdot I_{PK} \cdot \sin(W_{AC} \cdot t) \cdot \frac{t_{ON}}{t_S} = \quad (4)$$
$$\frac{1}{2} \cdot I_{PK} \cdot \sin(W_{AC} \cdot t) \cdot \frac{L \cdot I_{PK} \cdot \sin(W_{AC} \cdot t)}{V_{AC} \cdot \sin(W_{AC} \cdot t)} \cdot \frac{1}{t_S} =$$
$$\frac{1}{2} \cdot \frac{L \cdot I_{PK}^2}{t_S \cdot V_{AC}} \cdot \sin(W_{AC} \cdot t)$$

Here, L is the inductance of the inductor of switching converter 1B, $V_{AC}$ is the amplitude of the AC input voltage, and sin(WAC*t) is the sinusoidal half-wave signal having the same frequency and phase as the AC input voltage. Since parameters L, $I_{PK}$, $t_S$, and $V_{AC}$ are substantially constant in one power frequency cycle, input current $I_{AC,IN}$ can follow the AC input voltage to vary in each power frequency cycle. Correspondingly, peak value $I_{PK}$ of the inductor current can vary following direct current voltage $V_{BUS}$ rectified by the rectifier circuit, and peak value $I_{PK}$ can substantially have the same frequency and phase as direct current voltage $V_{BUS}$. Output current $I_{OUT}$ of the power stage circuit can be expressed as follows in formulas (5) and (6).

$$I_{OUT} = \frac{\frac{1}{2} L \cdot I_{PK}^2(t)}{V_{OUT} \cdot t_S} \quad (5)$$

$$t_S = t_{ON} + t_{OFF}, t_{ON} = \frac{L \cdot I_{PK}(t)}{V_{AC}(t)}, \text{ and } t_{OFF} = \frac{L \cdot I_{PK}(t)}{V_{OUT}}. \quad (6)$$

The peak value of the inductor current can be expressed as follows in formula (7).

$$I_{PK}(t) = \frac{V_{COM2} \cdot \sin(W_{AC} \cdot t)}{R_S} \quad (7)$$

Therefore, output current $I_{OUT}$ can also be expressed as follows below in formula (8).

$$I_{OUT} = \frac{L \cdot V_{COM2} \cdot \sin(W_{AC} \cdot t)}{2V_{OUT} \cdot R_S \cdot t_S} = \frac{V_{COM2} \cdot \sin(W_{AC} \cdot t)/R_S}{2V_{OUT} \cdot \left(\frac{1}{V_{AC}(t)} + \frac{1}{n \cdot V_{OUT}}\right)} \quad (8)$$

Here, "n" is the turns ratio of the primary winding and the secondary winding in the flyback converter of the present example.

Figure 6:
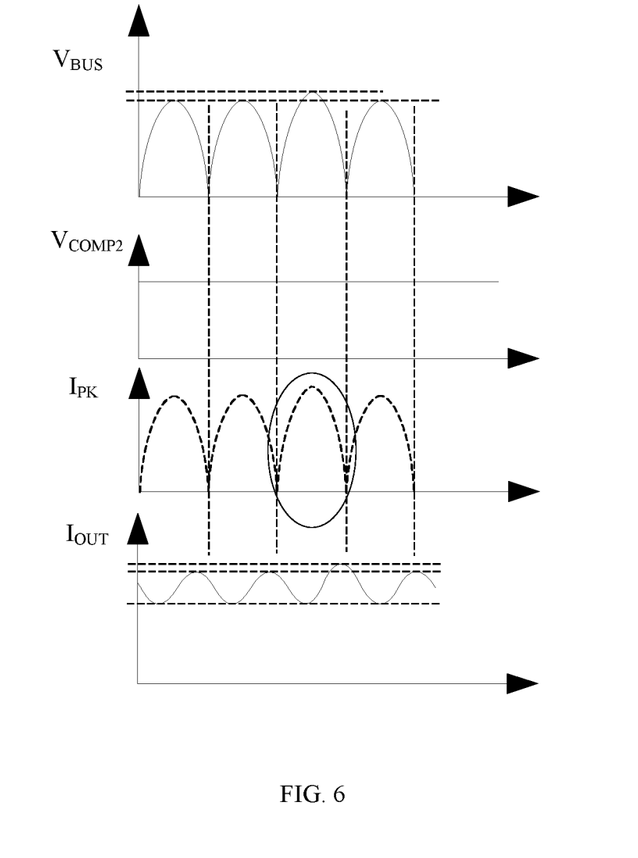
FIG. 6 is a waveform diagram of example operation of the LED driver of FIG. 1.

Referring now to FIG. 6, shown is a waveform diagram of example operation of FIG. 1. As a comparative embodiment, output current $I_{OUT}$ of the power stage circuit can be expressed as follows in formulas (9) and (10).

$$I_{OUT} = \frac{\frac{1}{2} L \cdot I_{PK}^2(t)}{V_{OUT} \cdot t_S} \quad (9)$$

$$t_S = t_{ON} + t_{OFF}, t_{ON} = \frac{L \cdot I_{PK}(t)}{V_{AC}(t)}, t_{OFF} = \frac{L \cdot I_{PK}(t)}{V_{OUT}}, \quad (10)$$

$$\text{and } I_{PK}(t) = \frac{V_{AC}(t) \cdot t_{ON}}{L}$$

Therefore, output current $I_{OUT}$ can be also expressed as follows below in formula (11).

$$I_{OUT} = \frac{V_{AC}(t) \cdot t_{ON}}{2V_{OUT} \cdot \left(\frac{1}{V_{AC}(t)} + \frac{1}{n \cdot V_{OUT}}\right)} \quad (11)$$

Here, "n" is the turns ratio of the primary winding and the secondary winding in the example flyback converter of FIG. 1. It can be seen that the output current of this example is related to the waveform of the AC input voltage, but the output current in particular embodiments is independent of the amplitude of the AC input power and may not be affected by jitters of the AC input voltage. As shown in FIGS. 5 and 6, the amplitude of the AC input power increases at the third half wave, such that the amplitude of direct current voltage $V_{BUS}$ can correspondingly increase. In the example shown in FIG. 6, the loop response is relatively slow and the inductor current not controlled, which makes the output current correspondingly increase. In the example of FIG. 5 in accordance with particular embodiments, the phase of the peak value of the inductor current in one power frequency cycle can vary following the phase of the AC input power, but the amplitude of the peak value may not be affected by the amplitude of the AC input power, and can remain stable.

Figure 7:
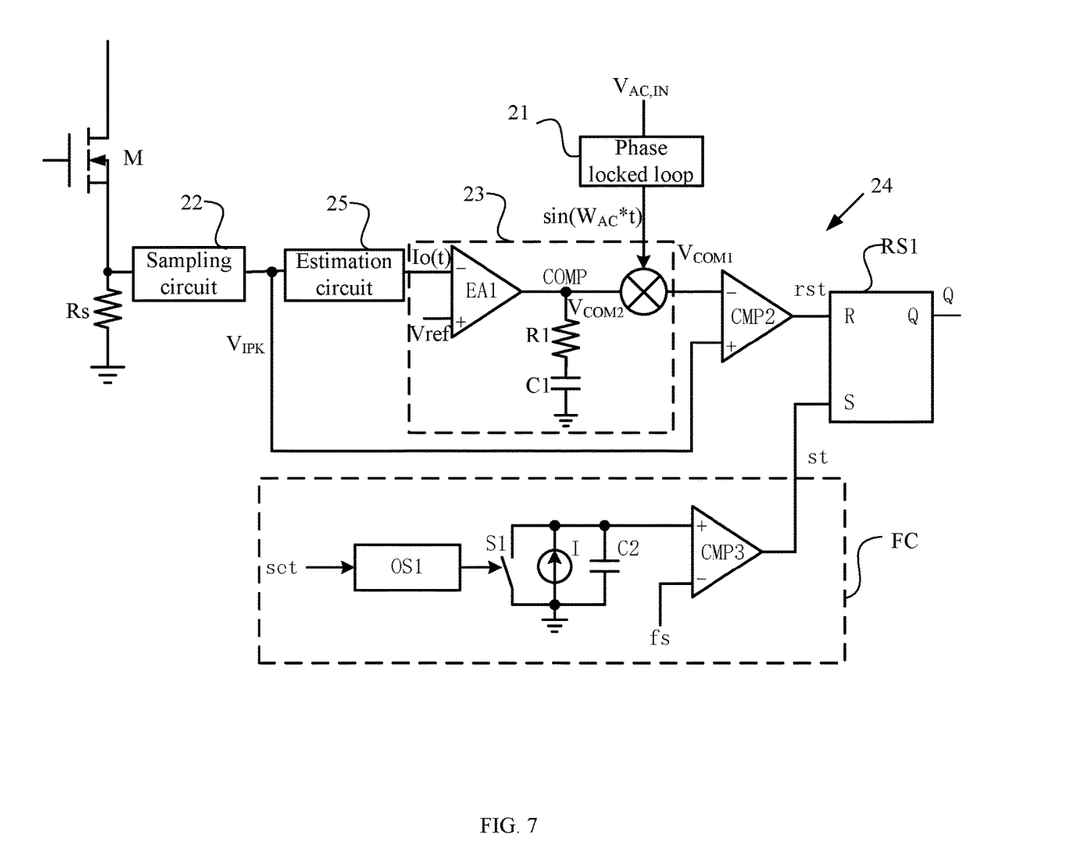
FIG. 7 is a schematic block diagram of another example control circuit, in accordance with embodiments of the present invention.

In another alternative example, the frequency of the switching control signal can be controlled by a frequency control signal; that is, the switching cycle can be controlled. Referring now to FIG. 7, shown is a schematic block diagram of another control circuit, in accordance with embodiments of the present invention. In this particular example, switching control signal generating circuit 24 can include comparator CMP2, frequency control circuit FC, and RS flip-flop RS1. Comparator CMP2 can compare sampling signal $V_{IPK}$ of the peak value of the inductor current against loop compensation signal $V_{COM1}$ in order to generate reset signal "rst." The output terminal of comparator CMP2 can connect to the reset terminal of RS flip-flop RS1. Frequency control circuit FC can generate set signal "st" to control the cycle of the switching control signal in accordance with frequency control signal "fs." RS flip-flop RS1 can generate switching control signal Q of power stage circuit 1 (see, e.g., FIG. 2) in accordance with set signal "st" and reset signal "rst." For example, when set signal "st" is high, RS flip-flop RS1 can generate a high output, when reset signal "rst" is high, RS flip-flop RS1 can generate a low output.

Thus, when the peak value of the inductor current increases to $V_{COM2}$* sin(WAC*t), the power transistor can be turned off, and when frequency control circuit FC generates a high level, the power transistor can be turned on. The switching cycle of the switching control signal can be determined by frequency control signal "fs." Frequency control circuit FC may be a timing circuit that can be triggered by set signal "st" generated, and can determine time length by frequency control signal "fs." Frequency control circuit FC can include single pulse trigger circuit OS1, switch S1, current source I, capacitor C2, and comparator CMP3. Single pulse trigger circuit OS1 can generate a single trigger pulse in accordance with set signal "st." Switch S1, current source I, and capacitor C2 can be connected in parallel, and switch S1 can be controlled by the single trigger pulse. Comparator CMP3 can compare a voltage of capacitor C2 against frequency control signal "fs" in order to generate set signal "st."

In frequency control circuit FC, when set signal "st" is switched from low to high, single pulse trigger circuit OS1 can generate a single trigger pulse at the rising edge of set signal "st" in order to control switch S1 to be turned on, such that capacitor C2 may be discharged through switch S1, and the voltage of capacitor C2 can be decreased to zero. When switch S1 is turned off, current source I can charge capacitor C2, and the voltage of capacitor C2 can be linearly increased to frequency control signal "fs." When the voltage of capacitor C2 is increased to be greater than frequency control signal "fs," set signal "st" can go from low to high, such that RS flip-flop RS1 is set, the power transistor can be turned on, and a new switching cycle may begin. Frequency control signal "fs" can be any suitable predetermined or variable value, such as current compensation signal $V_{CMP2}$, or a variable value having a maximum value in order to limit the lowest value of the switching frequency. In particular embodiments, the frequency of the switching control signal can be independent of the AC input power by including the frequency control circuit, such that a higher power factor can be achieved, and the switching control signal may not be affected by fluctuations of the AC input voltage.

In one embodiment, a method of controlling an LED driver can include: (i) generating a sinusoidal half-wave signal having the same frequency and phase as an AC input voltage by utilizing a phase-locked loop; (ii) generating a sampling signal of a peak value of an inductor current in a power stage circuit of the LED driver; (iii) generating a loop compensation signal in accordance with the sinusoidal half wave signal and a signal representing an output current of the power stage circuit; and (iv) generating a switching control signal for controlling the power stage circuit in accordance with the sampling signal and the loop compensation signal.

Figure 8:
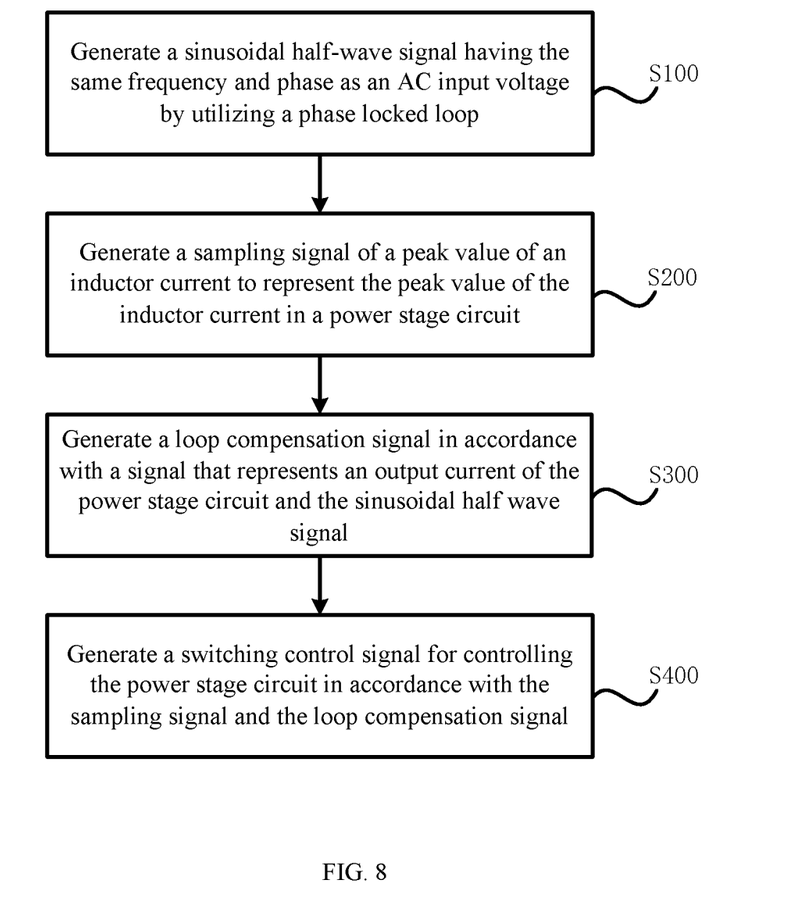
FIG. 8 is a flow diagram of an example control method, in accordance with an embodiment of the present invention.

Referring now to FIG. 8, shown is a flow diagram of an example control method, in accordance with an embodiment of the present invention. At S100, a sinusoidal half-wave signal having the same frequency and phase as the AC input voltage can be generated by utilizing a phase-locked loop. At S200, a sampling signal of the peak value of an inductor current in the power stage circuit can be generated. At S300, a loop compensation signal can be generated in accordance with a signal that represents the output current of the power stage circuit and the sinusoidal half wave signal.

For example, S300 can include generating a current compensation signal in accordance with the signal representing the output current of the power stage circuit, and generating the loop compensation signal by multiplying the current compensation signal and the sinusoidal half wave signal. Also for example, prior to S300, an output current estimation signal can be generated in accordance with the sampling signal of the peak value of the inductor current or a sampling signal of inductor current the inductor current, where the output current estimation signal can represent the output current of the power stage circuit.

At S400, a switching control signal of the power stage circuit can be generated in accordance with the sampling signal of the peak value of the inductor current and the loop compensation signal. Optionally, at S400, the sampling signal of the peak value of the inductor current can be compared against the loop compensation signal in order to generate the switching control signal of the power stage circuit. In some cases, S400 can include comparing the sampling signal of the peak value of the inductor current against the loop compensation signal to generate a reset signal, generating a set signal in accordance with a frequency control signal, and generating the switching control signal of the power stage circuit in accordance with the set and reset signals.

In particular embodiments, the sinusoidal half-wave signal having the same frequency and phase as the AC input voltage can be obtained by the phase-locked loop, and the switch control signal can be generated to control the power stage circuit such that the peak value of the inductor current follows the sinusoidal half-wave signal. Since the sinusoidal half-wave signal is at the same frequency and in phase with the input AC voltage, the peak value of the inductor current can be substantially the same frequency and in phase with the input AC power, thereby obtaining a higher power factor and lower total harmonic distortion. In addition, the amplitude of the sinusoidal half-wave signal may not change with the amplitude of the input alternating current, such that the peak value of the inductor current can be kept substantially stable. This can effectively prevent sudden changes of the output current that maybe caused by fluctuations of the power grid.

While a flyback converter is primarily utilized here in as an example power stage circuit, control circuits and methods of particular embodiments can also be applied to other power stage circuits of various topologies (e.g., boost converter, buck converter, buck-boost converter, etc.). The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a light-emitting diode (LED) driver, the method comprising:
   a) generating a sinusoidal half-wave signal having the same frequency and phase as an alternating current (AC) input voltage by utilizing a phase-locked loop;
   b) generating a sampling signal of a peak value of an inductor current in a power stage circuit of said LED driver;
   c) generating a loop compensation signal in accordance with said sinusoidal half wave signal and a signal representing an output current of said power stage circuit; and
   d) generating a switching control signal for controlling said power stage circuit by comparing said sampling signal of said peak value of said inductor current against said loop compensation signal.

2. The method of claim 1, further comprising:
   a) generating a current compensation signal in accordance with said signal representing said output current of said power stage circuit; and
   b) generating said loop compensation signal by multiplying said current compensation signal by said sinusoidal half wave signal.

3. The method of claim 1, further comprising generating an output current estimation signal in accordance with said sampling signal of said peak value of said inductor current or a sampling signal of said inductor current, wherein said output current estimation signal represents said output current of said power stage circuit.

4. The method of claim 1, further comprising:
   a) generating a reset signal by comparing said sampling signal of said peak value of said inductor current against said loop compensation signal;
   b) generating a set signal in accordance with a frequency control signal; and
   c) generating said switching control signal for controlling said power stage circuit in accordance with said set and reset signals.

5. A control circuit for controlling a power stage circuit of a light-emitting diode (LED) driver, the control circuit comprising:
   a) a phase-locked loop configured to generate a sinusoidal half-wave signal having the same frequency and phase as an alternating current (AC) input voltage;
   b) a sampling circuit configured to generate a sampling signal of a peak value of an inductor current in said power stage circuit;
   c) a loop compensation circuit configured to generate a loop compensation signal in accordance with said sinusoidal half wave signal and a signal representing an output current of said power stage circuit; and
   d) a switching control signal generating circuit configured to generate a switching control signal for controlling said power stage circuit, by comparing via a first comparator, said sampling signal of said peak value of said inductor current against said loop compensation signal.

6. The control circuit of claim 5, wherein said loop compensation circuit comprises:
   a) a first compensation circuit configured to generate a current compensation signal in accordance with said signal representing said output current; and
   b) a second compensation circuit configured to generate said loop compensation signal by multiplying said current compensation signal by said sinusoidal half wave signal.

7. The control circuit of claim 5, wherein said control circuit further comprises an estimation circuit configured to generate an output current estimation signal representing said output current of said power stage circuit in accordance with said sampling signal of said peak value of said inductor current or a sampling signal of said inductor current.

8. The control circuit of claim 5, wherein said switching control signal generating circuit comprises:
   a) a second comparator configured to compare said sampling signal of said peak value of said inductor current against said loop compensation signal to generate a reset signal;
   b) a frequency control circuit configured to generate a set signal in accordance with a frequency control signal; and
   c) an RS flip-flop configured to generate said switching control signal for controlling said power stage circuit in accordance with said set signal and reset signals.

9. The control circuit of claim 8, wherein said frequency control circuit comprises:
   a) a pulse circuit configured to generate a trigger pulse signal in accordance with said set signal;
   b) a switch, a current source, and a capacitor coupled in parallel, wherein said switch is controlled by said trigger pulse signal; and
   c) a third comparator configured to compare a voltage of said capacitor against said frequency control signal to generate said reset signal.

* * * * *